United States Patent
Waas et al.

[11] Patent Number: 6,107,207
[45] Date of Patent: Aug. 22, 2000

[54] PROCEDURE FOR GENERATING INFORMATION FOR PRODUCING A PATTERN DEFINED BY DESIGN INFORMATION

[75] Inventors: Thomas Waas, München; Hans Hartmann, Wessling, both of Germany

[73] Assignee: Applied Integrated Systems & Software, München, Germany

[21] Appl. No.: 09/298,393

[22] Filed: Apr. 23, 1999

[30] Foreign Application Priority Data

Apr. 24, 1998 [DE] Germany ............................ 198 18 440

[51] Int. Cl.[7] .................................................. H01L 21/00
[52] U.S. Cl. .............................. 438/707; 216/60; 216/66; 438/8; 438/742; 438/949
[58] Field of Search ............................ 438/8, 9, 14, 129, 438/707, 712, 689, 725, 942, 948, 949; 216/59, 60–66, 84; 430/5, 296

[56] References Cited

U.S. PATENT DOCUMENTS 5,725,974  3/1998  Kawahira .
5,792,581  8/1998  Ohnuma .
5,891,806  4/1999  Shibuya et al. ........................ 438/707

FOREIGN PATENT DOCUMENTS 4317899  9/1997  Germany .

OTHER PUBLICATIONS

W. Maurer et al., "Evaluation of a fast and flexible OPC package: OPTISSIMO," Photomask Technology and Management, SPIE 2884, p. 412 ff., 1996.

C. Dolainsky et al., Application of a simple resist model to fast optial proximity correction, Optical Microlithography X, SPIE 3051, p. 774 ff., 1997.

C. Dolainsky, et al., "Evaluation of resist models for fast optical proximity correction," 17th BACUS Symposium on Photomask Tech., Proc., SPIE 3236, p. 202 ff., 1998.

H. Eisenmann et al., "PROXECCO–Proximity effect correction by convolution," Vac. Sci. Technol. (B.116), Nov./Dec. 1993, p. 2741–2745.

*Primary Examiner*—William Powell
*Attorney, Agent, or Firm*—Philip Summa, P.A.

[57] ABSTRACT

A method for generating information for producing a pattern, defined by design information on a medium, using at least one direct-writing pattern generating process, which first provides the design information and then calculates correction data based on the provided design information and depending on the pattern generating process which corrects pattern faults in the pattern to be generated which were caused by the pattern generating process. The design and correction information is then separately provided to the direct-writing pattern generating process for its activation.

12 Claims, 8 Drawing Sheets

PROCEDURE FOR GENERATING INFORMATION FOR PRODUCING A PATTERN DEFINED BY DESIGN INFORMATION

FIELD OF THE INVENTION

The present invention refers to a procedure for generating information for producing a pattern defined by design information on a medium using at least one direct-writing pattern generating process.

The present invention refers, in particular, to the provision of information for the generation of a pattern, i.e., an integrated monolithic circuit on a substrate or to the generation of information for generating a mask which is used during further substrate patterning process steps to generate an integrated monolithic circuit.

BACKGROUND OF THE INVENTION

A considerable process step of semiconductor process technology is the so-called pattern transfer and/or the transfer of a pattern onto a medium to be patterned, for which purpose lithography is used. In general, a distinction is made between optical lithography or electron-beam lithography and ion-projection lithography. In case of the optical lithography, the generation of the pattern or the transfer of the pattern to a substrate to be patterned is achieved by using a mask that is respectively patterned to generate the required pattern on the substrate during exposure. For ion-projection lithography, masks can also be used for pattern imaging. Using electron-beam lithography, the required pattern can be directly written onto a respective substrate without the use of a mask. The above lithography processes can also be combined in any way, so that, for instance, certain patterns are produced by optical lithography and other patterns are written directly onto the already prestructured wafer and/or substrate using electron-beam lithography.

Developments in the semiconductor technology provide increasingly finer chip patterns and circuit complexity. The aforementioned pattern transfer is a critical process step for the production of complex semiconductor process technology patterns. In order to obtain the required pattern accuracy during the pattern transfer procedure, starting from the chip layout up to the etched wafer pattern, process influences causing pattern distortion and thus yield losses must be considered and/or compensated for.

Depending on the used lithography process, various correction methods are used to correct the pattern distortion induced by the pattern transfer procedure.

In case of the optical and ion-projection lithography, using masks as projection template, imaging distortions and pattern-distorting process influences are, for instance, corrected by a geometric optimisation of the chip layout information at mask level.

In the optical lithography, this correction method is referred to as "optical proximity correction" and is, for instance, described in the articles "Evaluation of a fast and flexible OPC package: OPTISSIMO," W. Maurer, T. Waas, H. Eisenmann, Photomask Technology and Management, SPIE 2884, p. 412 ff., 1996, "Application of a simple resist model to fast optical proximity correction," C. Dolainsky, W. Maurer, Optical Microlithography X, SPIE 3051, p. 774 ff., 1997 and "Evaluation of resist models for fast optical proximity correction," C. Dolainsky, W. Maurer, T. Waas in 17$^{th}$ BACUS Symposium on Photomask Tech, Proc., SPIE 3236, page 202 ff., 1998.

To increase pattern fidelity during electron-beam lithography, the electron-beam energy or the dose value can be modulated to achieve the required pattern fidelity. The correction of the proximity effect during electron-beam lithography is, for instance, described in DE4317899C2 and in article "PROXECCO—Proximity effect correction by convolution," H. Eisenmann, T. Waas, H. Hartmann, J. Vac. Sci. Technol. B(116), Nov./Dec. 1993, pages 2741–2745.

With reference to FIG. 6, a known prior art procedure for maintaining the required pattern accuracy during a pattern transfer process as part of the production of semiconductor process technology pattern is described below.

In a first process stage S600, design information representing the required information for a specified chip design, is provided. Based on this design information, a layout of the required chip pattern is generated, which is then processed further in step S602. The example shown in FIG. 6 relates to a production procedure which, using an electron beam, writes directly onto a wafer or a substrate. In step S602 a proximity correction using the steps described in the above listed prior art publications, is now carried out in addition to the further processing. In the described example, an electron-beam proximity correction can be carried out via the dose, i.e., for certain areas of the layout certain dose values are set for the electron beam to ensure pattern accuracy and to prevent pattern distortion. In step S602 a correction of the process influences can be carried out in addition or instead of the dose correction via the layout geometry, by, for instance, certain edges of the layout being displaced to prevent pattern distortion in order to compensate for the distortion generated by the production procedure. Based on the carried out corrections, the layout is revised in step 602, so that after step S602a corrected layout in which the fault correction has been considered, is achieved. This corrected layout is used in step 604 to control the electron-beam exposure which in this case, for instance, exposes a resist, so that a resist image is formed on the wafer to be patterned after step S604. During the following process steps S606, the final pattern of the wafer is generated by, i.e., the development of the resist and additional etching steps, until the final result is the patterned wafer. To explain the layout change in step S602, one example, showing in which way a predetermined layout is changed by the correction, is described below with reference to FIG. 7 and 8.

With reference to FIG. 7, an example in which the proximity correction is achieved by setting the dose values for an electron beam during exposure, is described below. FIG. 7a shows layout 700 as an example. The layout contains four rectangles 702, of which two are separated by a vertical gap 704 and thin lines 706 are arranged between the two rectangle pairs. The layout 700 shown in FIG. 7a is defined by design information provided in step S600 and the proximity correction in step S602 results in a corrected layout 710 as shown in FIG. 7b. As clearly apparent from a comparison between FIG. 7a and 7b, the correction causes the rectangles 702 shown in FIG. 7a to now be formed by several smaller rectangles 712, with the same applying to the lines 702. The correction in step S602 causes different dose values for the electron beam exposure to be assigned to the respective rectangles 712 of the layout pattern shown in FIG. 7b in order to compensate for the pattern distortion during pattern transfer.

As clearly apparent from a comparison between FIG. 7a and 7b, the "simple" layout (see FIG. 7a) has already in this example changed to a very complex layout (see FIG. 7b), which compared to the original layout can only be written to with a considerably higher information quantity.

With reference to FIG. 8, a further example will now be described in which, contrary to FIG. 7, not the layout for writing directly to the substrate but the layout for producing a mask for optical lithography, is corrected.

FIG. 8a, shows the layout 800, defined by design information, which is made up of a simple pattern of several conductor lines 802. As a result of the above described optical proximity correction, a mask pattern 804, shown in FIG. 8b, in which critical points 806 were corrected, is produced. When looking, for instance, only at the conductor line at the very right of FIG. 8a and comparing it with the corrected conductor line shown in FIG. 8b, it is apparent that as a result of the proximity correction the information quantity required for writing the mask layout has considerably increased. Whilst the structure shown in FIG. 8a could still be written by simple data sets, a comparison with FIG. 8b shows that considerably more information is required for writing this design than for FIG. 8a.

The optimal layout geometry and/or dose distribution for correcting process influences, described with reference to the above example and determined by complex calculations, generates the described geometric layout information change. Consequently, the initial information for the mask production or for the electron-beam lithography increases in complexity and in order of magnitude.

Known prior art fault correction solutions therefore have the disadvantage that, due to the carried out correction measures, the layout is changed considerably in its form and/or size and, in particular, in the information quantity. This will be disadvantageous for gigabit and terabit layout sizes expected in future, as due to the implementation of the corrective measures, direct geometrical changes and due to the associated increase in layout complexity and information quantity, such layouts can no longer be sensibly used.

Another disadvantage of this solution is that the corrective measure is carried out individually or independently from the pattern generating procedure or the device used for this purpose, so that no ideal adaptation to the system carrying out the patterning, such as an electron-beam system, is possible. A further disadvantage is that the "double implementation, i.e., the provision of the layout and then the implementation of the correction, the combination of layout and correction for generating a corrected layout and the subsequent transfer to the pattern generating system, limits the improvement of the achievable pattern accuracy in the final pattern on the wafer. A further disadvantage is that in an attempt to compensate for various process influences, the layout complexity and information quantity already increased by a first correction measure, is again increased in orders of magnitudes if further process influences are to be corrected.

Another disadvantage, ie., that the transfer of the layout information in the process is extremely difficult due to the changing circuit complexity, is apparent.

OBJECT AND SUMMARY OF THE INVENTION

Based on this prior art, the present invention has the task to provide a procedure for generating information for processing a pattern defined by design information on a medium which avoids the aforementioned disadvantageous of increases in layout complexity and information quantity to be processed.

This task is solved by a procedure according to claim 1.

The present invention provides a procedure for generating information for processing a pattern defined by design information on a medium using at least one direct-writing pattern generating process containing the following steps:

a) provision of design information;
b) based on the provided design information and depending on the pattern generating process, generation of correction information correcting the pattern fault caused by the pattern generating process in the pattern to be generated; and
c) the separate provision of design and correction information for activating the direct-writing pattern generating process.

The present invention is based on the knowledge that the aforementioned problems can be solved by separating the information between the layout and correction measure, by. for instance, representing and storing the correction result or the correction measure separately from the layout as correction information and that the initial design and correction information is used separately for activating the direct-writing pattern generating process.

The inventive concept of separating the layout and correction measure has the advantage that the layout initially defined by the design information also remains unchanged in form and size as initial layout, i.e., is not influenced by correction measures to be separated. This has the advantage that also future gigabit and terabit layout sizes will remain manageable as no difficult and complex incorporation of the corrective measures into the layout, as shown in prior art embodiments, is required, thus avoiding the respective increase in layout complexity and information quantity.

A further advantage is that as a result of the separate representation of the corrective measures, the actual correction step is transferred to a local optimisation. The corrective measure can therefore also be carried out by hardware, i.e., directly in an electron-beam writing machine. This allows, for instance an ideal adaptation of the correction step to the implementing electron-beam system.

In general, an implementation of the correction close to the machine has the advantage that this causes a significant increase of the achievable pattern accuracy, as no "additional" implementation of the corrective measure in the layout is required. Also the information throughput is considerably increased whilst the layout complexity and information quantity is not affected by the correction measure.

Another advantage is that different process influences and their respective correction measures can easily be combined in, for instance, a correction matrix, by using the superposition principle.

A further advantage is that the safer and easier manageability of layout information in the process as a result of the unchanging circuit complexity.

According to a preferred embodiment of the present invention, the correction information is represented in a correction matrix through which, for instance, a respective coordinate system is defined which is assigned to the pattern to be generated, with the individual correction values being assigned to coordinate values of the coordinate system. The correction values can be scalar values, representing an intensity or an amount of a shift in the beam direction of the beam used for the generation of the pattern. According to another embodiment, the correction values can represent vectors representing an amount and a direction of a shift of the beam used for generating the pattern.

The present invention generates the information either for generating the pattern on a substrate or for generating a mask as used, for instance, in optical lithography.

The pattern generating processes are direct-writing pattern generating processes, generating a pattern, for instance, with an electron, ion or a light beam.

Preferred further embodiments of the present invention are defined in the subclaims.

BRIEF DESCRIPTION OF THE DRAWINGS

The following preferred embodiments of the present invention are described below with reference to the enclosed drawings, in which:

FIG. 4a represents the layout already shown in FIG. 3a;

FIG. 7b shows a layout corrected according to prior art, based on an initial layout as shown in FIG. 7a;

FIG. 8b shows a layout corrected according to prior art, based on an initial layout as shown in FIG. 8a.

DETAILED DESCRIPTION OF THE PREFERRED EMBODIMENTS

Figure 1:
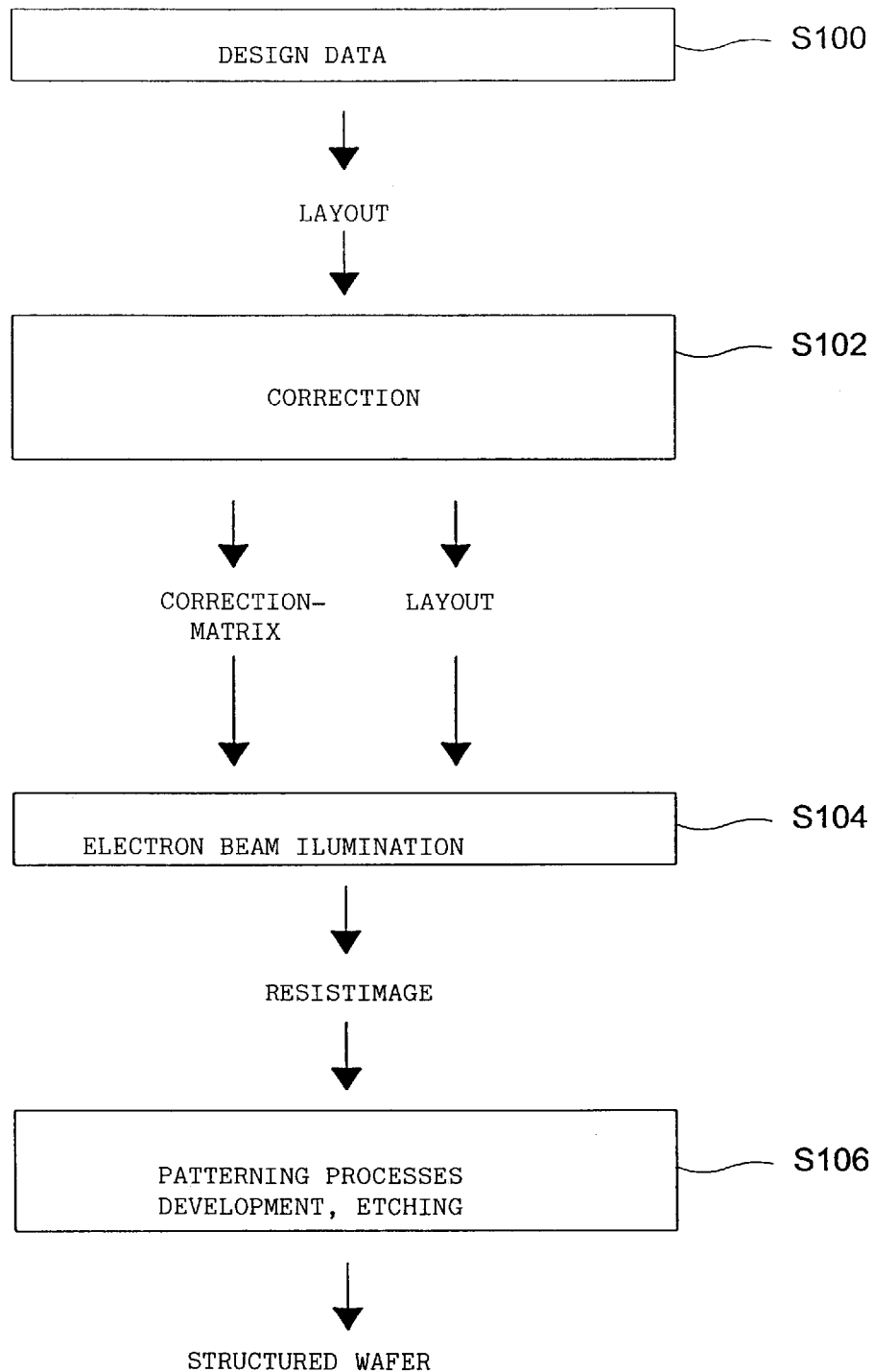
FIG. 1 contains a flow chart, showing the use of the inventive procedure for the electron beam lithography.

Below the inventive procedure for generating information for processing a pattern on a medium is explained in detail with reference to FIG. 1. In a first step S100, design information that defines the pattern to be generated on the medium, is provided. The design information determines the layout of the pattern to be generated. In step S102, a correction is carried out to compensate for or to prevent pattern distortion on the patterned wafer. In FIG. 1, the inventive procedure is explained with reference to electron-beam lithography during which direct writing to the wafer to be patterned is carried out. The inventive procedure may, however, also be used for the generation of masks for optical lithography.

According to the shown embodiment, a proximity correction of the electron beam is carried out in step S102 by correcting the dose distribution or the intensity of the electron beam. Contrary to the aforementioned prior art embodiments, no corrected layout is this time generated in step S102 but the received correction values are transformed instead into correction information which is output as a correction matrix according to an embodiment example. As shown in FIG. 1, the correction information and layout information or design information is separately available after step S102 and is used in step S104 for activating the electron-beam system to implement the required electron-beam exposure. After the electron-beam exposure in step S104 a resist image of the pattern to be generated has, for instance, been generated, which in the subsequent patterning processes 106, such as development, etching, etc. then produces the patterned wafer which then, for instance, contains the integrated circuit determined by the design information.

Figure 2A:
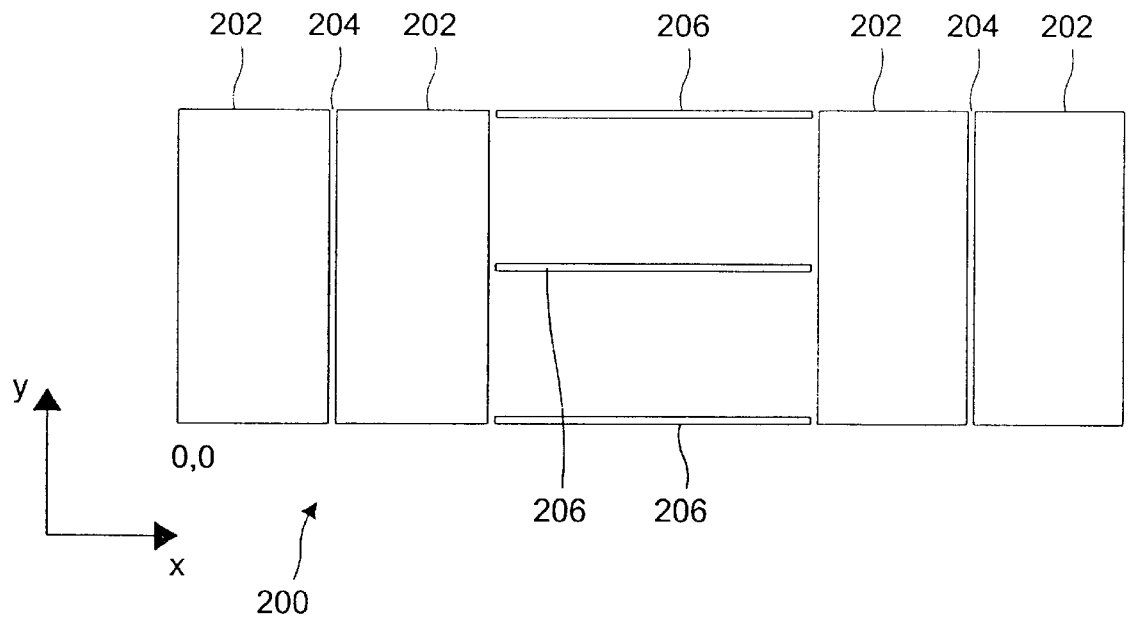
FIG. 2a is an example of a layout.
Figure 2B:
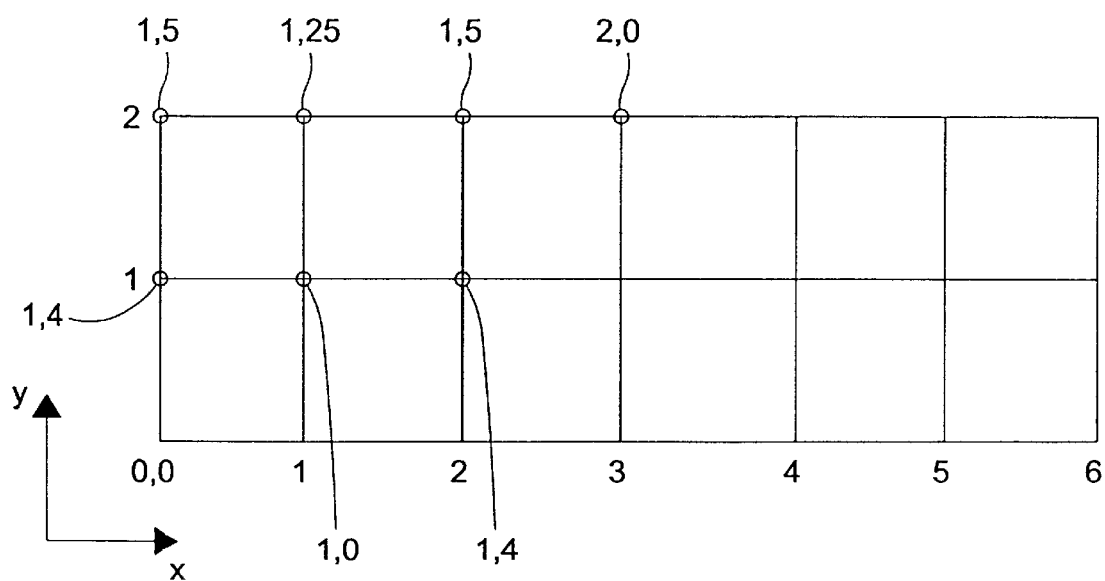
FIG. 2b shows the correction matrix generated according to the present invention of an embodiment of the present invention.
Figure 7A:
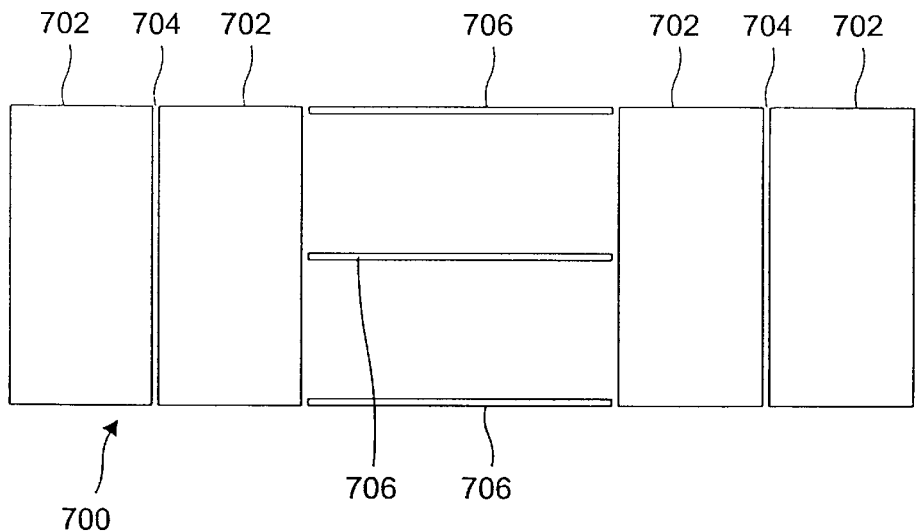
FIG. 7a represents a layout example.
Figure 7B:
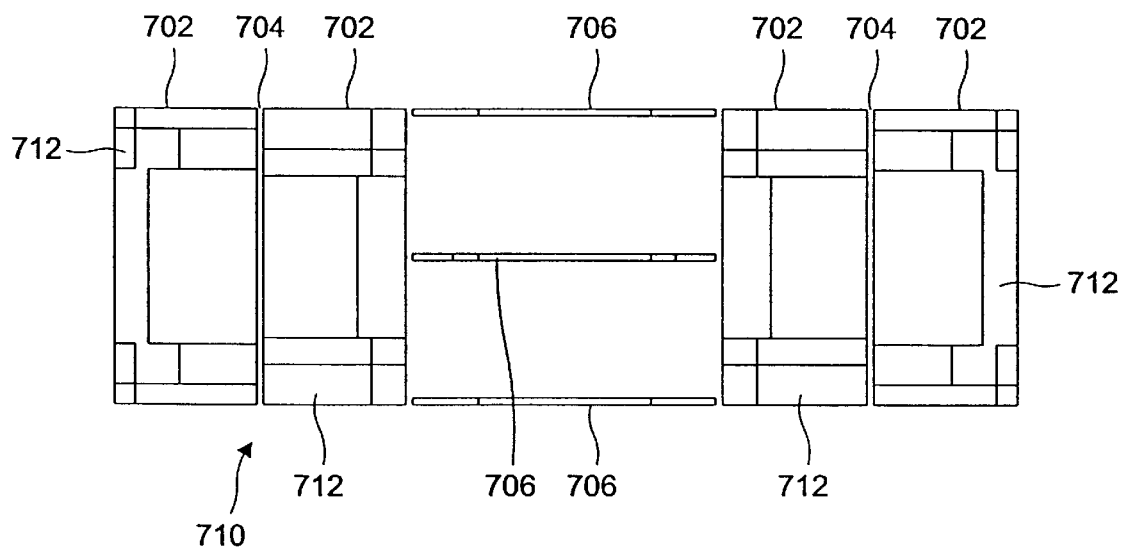
Figure 8A:
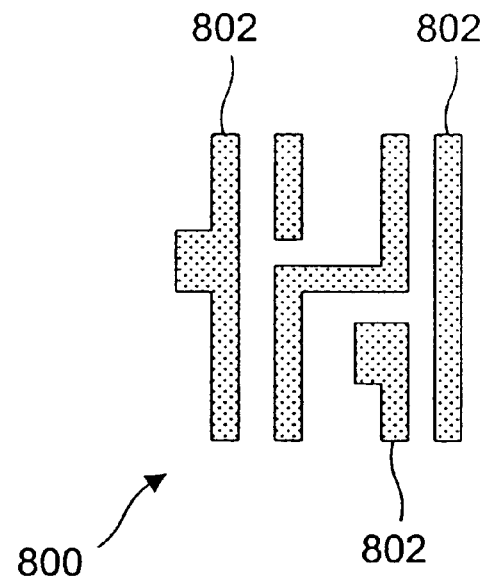
FIG. 8a represents an example for a further layout.
Figure 8B:
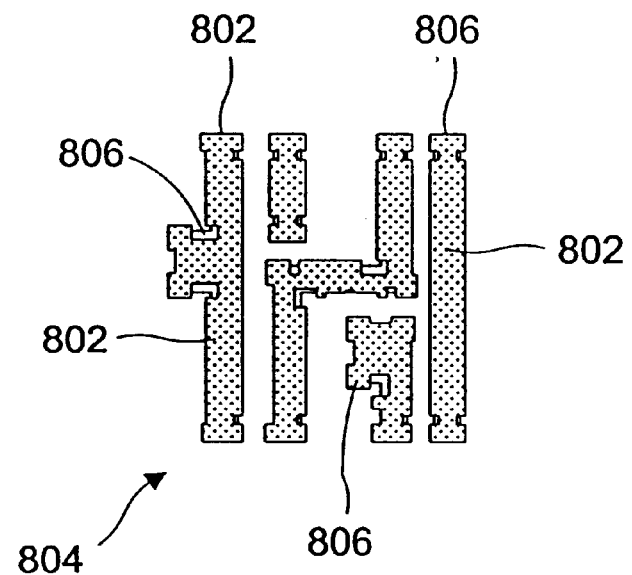

Below, an electron-beam lithography embodiment using the inventive procedure is described with reference to FIG. 2. FIG. 2a shows a layout 200 corresponding to the layout already shown in FIG. 7a. The layout 200 is defined by the design information specified in step S100 and comprises several rectangular elements 202, of which two are separated by a gap 204. Furthermore, lines 206 are arranged between the two rectangle pairs. In order to compensate for pattern distortions caused by process influences, the correction information is calculated in step S102 and is then stored in a matrix format according to an embodiment example. FIG. 2b shows an example of a two-dimensional correction matrix. In this embodiment example, a Cartesian co-ordinate system, assigned to the pattern to be generated, is determined by the matrix, by, for instance, the source of the co-ordinate system, determining the bottom left corner of the layout 200.

The individual correction values are assigned to the co-ordinate values in the embodiment shown in FIG. 2.

In order to provide the electron-beam exposure system with the required dose information for the individual points of the layout, as described in FIG. 1, the layout and the correction information is used separately to activate the electron-beam exposure device and this system sets the dose information stored at the respective co-ordinate position in the correction matrix for certain sections of the layout to be written, in order to carry out the required correction of pattern distortions. It should be noted that, depending on the pattern of the layout and depending on the required correction measures, the applied co-ordinate system or grid can be finer or wider meshed than shown in FIG. 2b. Values, representing, for instance, standardised values which are then processed by the electron-beam exposure system to set the respective dose at this point are assigned to the individual co-ordinate values (0,0) to (6,5). The respective dose values may, however, also be stored with the individual coordinate values so that no additional conversion in the electron-beam exposure device is required, with the exact design depending on the used electron beam exposure device.

As an example, FIG. 2b shows several values for the correction values stored at the co-ordinate values. At the co-ordinate value (1,1), the correction value is 1,0 which can, for instance, show that a standard dose of the electron-beam exposure system is used in this area, with, for instance, 1.5 times the standard dose setting to be used in the area of correction value (0,2).

The co-ordinate values or line cross-over points shown in FIG. 2, are supporting points for the calculation of the dose values that are stored in the shown two-dimensional matrix. Where intermediate values are required, these can be established by interpolation. Based on the thus stored correction values and possibly an interpolation of intermediate values, the actual correction is carried out in the electron-beam exposure device.

As shown in FIG. 2, the separation and representation of the correction results of the layout pattern in the embodiment shown in the figure, is carried out through the calculation and outputting of the two-dimensional matrix, specifying the optimum dose values to the respective x/y co-ordinate values.

It should be noted that the present invention is not limited to determining certain dose values for an electron-beam established via the correction matrix. Instead of the dose value for an electron beam, also generally determined intensity values or values assigned to certain intensities for a beam such as an electron beam, ion beam or light beam, can be used so that the example described with reference to FIG. 2 is suitable for any direct-writing manufacturing process.

In place of the dose values described in FIG. 2, the correction values can also represent shift values. Such a shift value shows, for instance, that the electron beam deviates at this point from the pattern determined by the layout by the specified value and moves, for instance, one edge by the specified value, to allow the respective correction of pattern faults.

Figure 3:
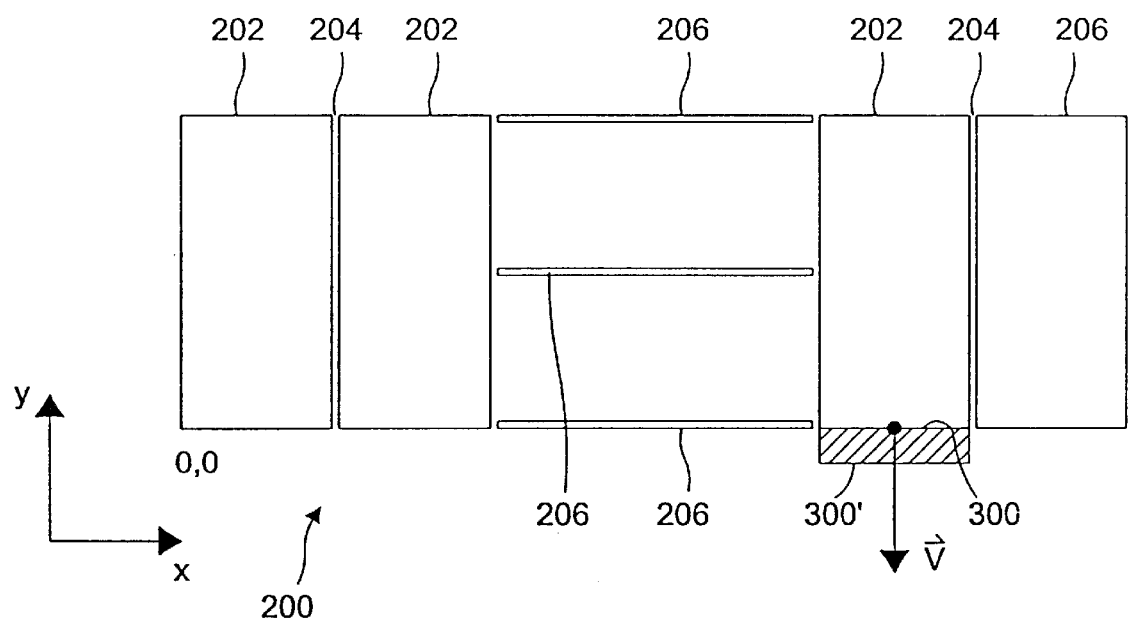
FIG. 3 shows the correction of distortions according to another embodiment of the present invention.

In place of the aforementioned scalar values, the correction values can also be vector values, defining the ideal correction value in amount and direction in relation to its coordinate value to, for instance, define a respective shift of an edge of a layout during the generation of the pattern with regards to the size of the shift and its direction. Such an example is shown with reference to FIG. 3, in which vector v causes the edge 300 determined by the layout 200 during the generation of the pattern, to be shifted in direction v, so that the electron beam generates the edge 300' during writing. The respective vector information, i.e., the amount and direction of shift, is stored in the correction matrix which is in this case is a two-dimensional vector matrix and is transferred to the pattern-generating process during the generation of the pattern.

This measure allows, distortions to be corrected during direct writing and to carry out a geometrical correction.

Figure 4A:
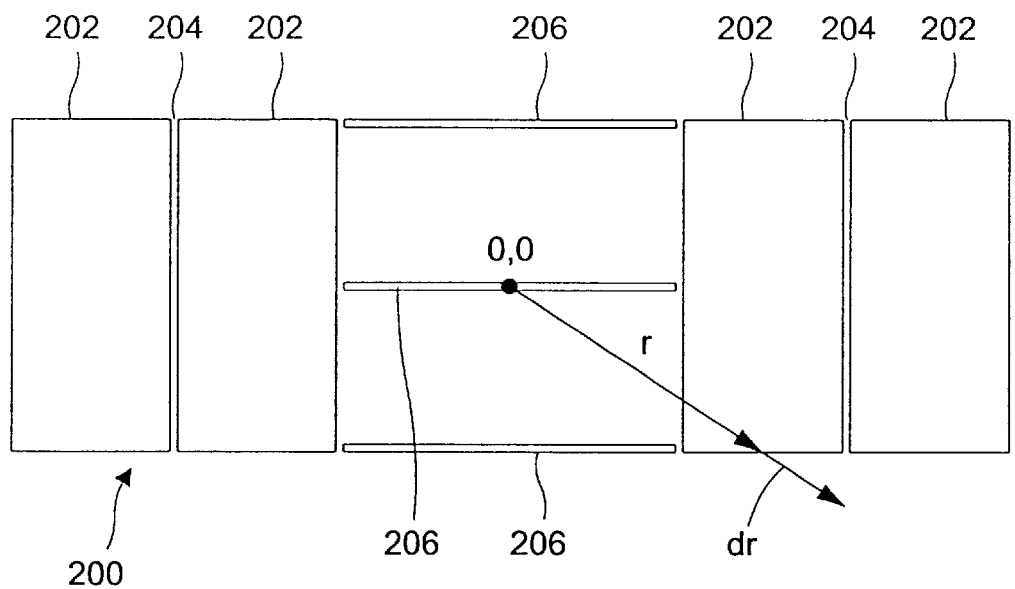
Figure 4B:
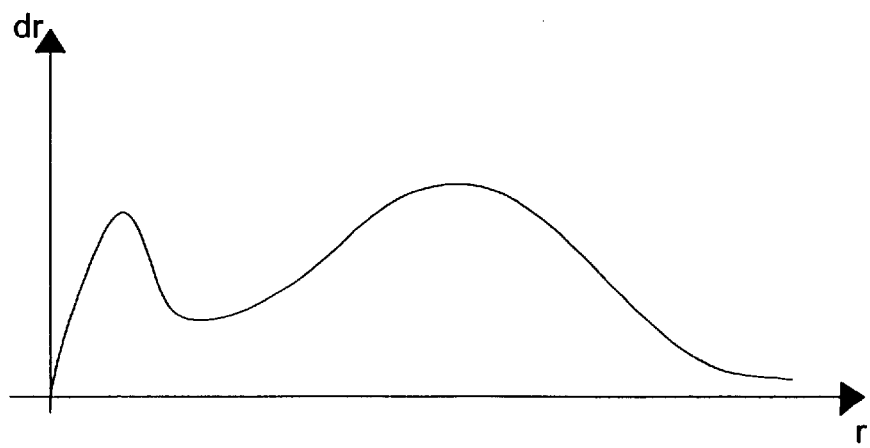
FIG. 4b shows the correction values stored in a correction matrix according to another embodiment of the present invention.

A further option for a geometrical correction is described with reference to FIG. 4. FIG. 4a shows the layout known from FIG. 2a, and in this embodiment the pattern is generated by ion projection which, without fault correction, would cause a mainly radial projection fault. As shown in FIG. 2a, a source of a coordination system is positioned at the centre of a layout, as shown by (0,0): The correction is carried out in such a way that it is determined for an ion beam which is to carry out the structuring at a certain point of the layout, whether in this position, as marked by arrow r, a correction in form of a shift of the edge, should be carried out. In order to carry out the required correction, respective shift values dr are stored in the correction matrix for each radius value, as shown schematically in FIG. 4b. Depending on the position, a shift value dr is assigned for every value for r, by which the beam is shifted during pattern generation in order to avoid a pattern fault with the generated pattern. As apparent, no correction is required in the source, as no shift is carried out at this point.

With reference to FIG. 5, an example of an electron-beam writing machine will now be described in detail, to which the information generated by the inventive procedure, i.e., the correction information and layout information, are provided.

Figure 5A:
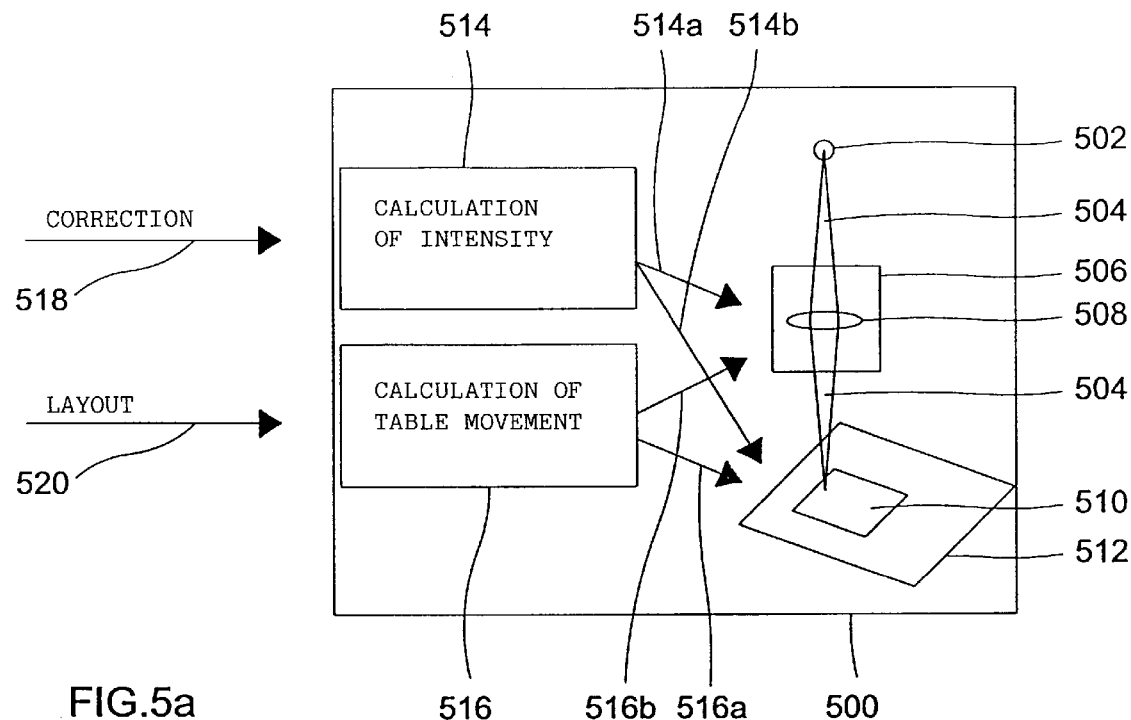
FIG. 5a is an example of an electron-beam writing machine, operating with information as provided by the present invention.

FIG. 5a contains a schematic representation of a complete electron-beam writing machine with the reference number 500. The electron-beam writing machine comprises an electron source 502 for generating an electron beam 504. The electron beam 504 is directed onto a substrate 510 to be processed via a lens 506 and an aperture 508.

The substrate is located on a table 512 which, preferably, can be displaced along its x and y axis. The electron-beam writing machine 500 also contains a first control unit 514 and a second control unit 516 which control the other components of the writer 500 as indicated by arrows 514a, 514b, 516a, 516b. The information generated by the inventive procedure is input into the control units 514, 516 as shown by arrows 518 and 520.

The first control unit 514 contains the correction information 518 and the second control unit 516 contains the layout information 520. Based on the correction information, which is, for instance, available in the format of the aforementioned correction matrix, the required intensity of the electron beam 504 is calculated and the electron source 502 is respectively controlled 514a in the first control unit 514. In addition or in place of the intensity control of the electron beam 504, its speed whilst writing onto the substrate 510 can be controlled 514b, to achieve the required intensity value for an intensity/dose directed onto a point via the time integral.

The second control unit 516 contains the layout information 520 from which it calculates the required table shift and generates the required control signals 516a, 516b for displacing the table 512 and controlling the beam 504 or the aperture 508 in order to pattern the substrate 510 according to the received layout information 520.

The electron-beam writing machine 500 can be a scanning system with a Gaussian-shaped exposure source 502 which allows the electron beam 504 to be directly directed onto substrate 510 via the lens 506 or can be a system that directs the electron beam 504 onto a substrate 510 via an aperture 508.

Figure 5B:
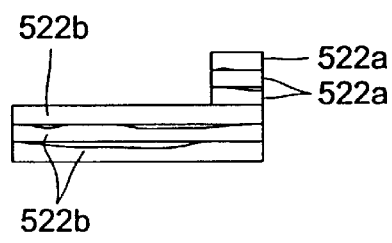
FIG. 5b shows the scanning system of the electron-beam writing machine of FIG. 5a with a beam-shaped source.

FIG. 5b shows the scanning system of an electron-beam writing machine 500 with a beam-shaped electron source 502. As is apparent from the figure, the system writes individual paths 522 onto the substrate, whose length or dimensions are specified by the layout and the correction.

Figure 5C:
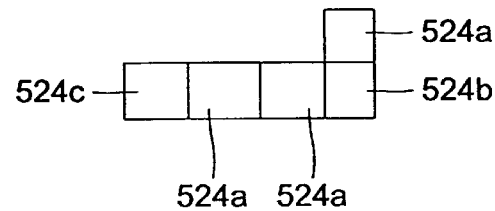
FIG. 5c shows the scanning system of the electron-beam writing machine of FIG. 5a with a variable aperture.
Figure 6:
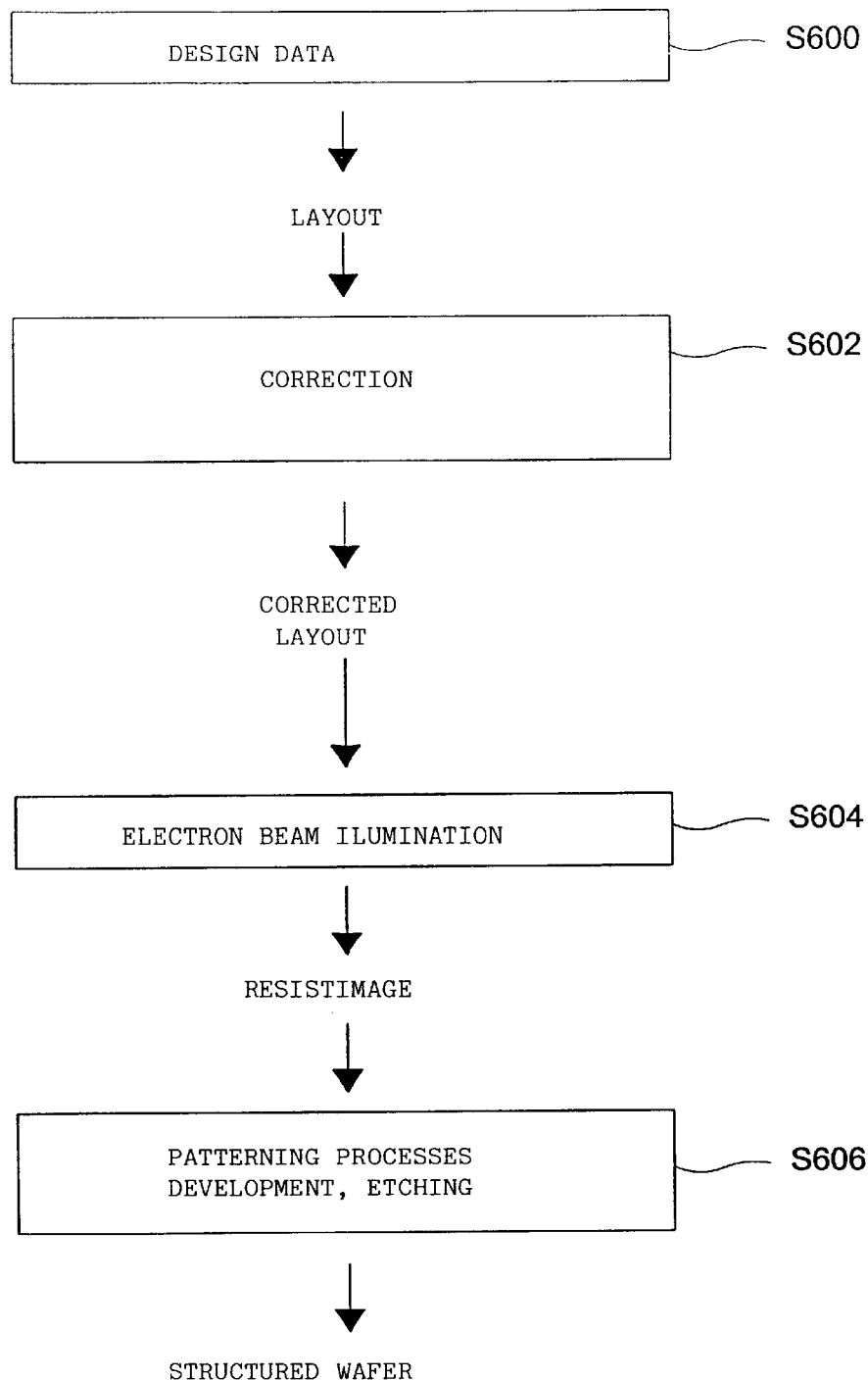
FIG. 6 shows a flow diagram, representing a standard procedure for correcting pattern faults.

FIG. 5c shows the scanning system of an electron-beam writing machine 500 with a variable aperture. Contrary to the beam-shaped electron source, this system writes individual fields 524a, 524b, 524c onto the substrate with the dimension of the fields being determined by the variable aperture, which is activated depending on the received layout information 520 and the received correction information 518.

The writing machine 500 shown in FIG. 5 calculates the provided layout pattern 520 of the geometric exposure procedure, i.e., the exposure position on the mask or on the substrate 510 is calculated via a respective table control which places the substrate 510 accordingly underneath the writer or the electron beam 504. The pattern is then sequentially transferred.

The correction information 518, i.e., in form of a matrix with corrected dose values, is forwarded to the intensity control 514, which in accordance with the correction values, controls, i.e., the intensity of the beam dwelling time on the exposure location. In case of a geometrical correction, the exposure location or the aperture is corrected accordingly via the correction matrix.

It should be noted that the present invention is not limited to correcting faults which are caused by an effect but that it is possible to combine various process influences and their respective correction measures in a correction matrix.

The present invention thus offers the aforementioned advantages as a result of the correction result or the correction measure being stored separately from the layout. For optical lithography and ion-projection lithography, the information is, for instance, stored in a two-dimensional vector matrix, with each vector representing the ideal correction value (value and direction) in relation to its coordination values. Intermediate values can, in this case, be generated by interpolation.

For electron-beam lithography using exposure devices supporting a dose modulation, the ideal dose value can be calculated in place of the geometric correction value and can be represented in the correction matrix. The dose value for the exposure step can be determined from the values of the local correction matrix in combination with the selected aperture size.

Instead of electron-beam lithography or ion-projection lithography, the inventive procedure can also be used with optical procedures in which, i.e., direct writing on the substrate or mask is carried out by a stepper or a laser writer.

It is also possible to carry out a computer simulation of the finished pattern prior to the provision of the correction and layout information activating the pattern generating process, by, i.e., superimposing the dose values determined by the correction matrix onto the original layout and visually displaying the result through different colour graduations.

What is claimed is:

1. A method for generating information for producing a pattern defined by design information onto a medium using at least one direct-writing pattern generating process, containing the following steps:
   a) provision (S100) of design information;
   b) based on the provided design information and depending on the pattern generating process, generation (S102) of correction information, correcting the pattern faults caused by the pattern generating process in the pattern to be generated; and
   c) separate provision of the design and correction information to activate the direct-writing pattern generating process.

2. A method according to claim 1, in which the medium on which the pattern is to be generated, is a substrate or a mask for transferring the structure onto a substrate.

3. A method according to claim 1 in which the design information defines a layout (200) of an integrated circuit.

4. A method according to claim 1, in which the correction information effects a correction of pattern faults caused by a proximity effect.

5. A method according to claim 1, in which the direct-writing pattern generation process generates the pattern with the aid of an electron, ion or light beam.

6. A method according to claim 1 in which the correction information is available in a correction matrix which contains correction values corresponding to the correction information.

7. A method according to claim 6, in which a co-ordinate system which is assigned to the generated pattern is defined by the correction matrix, with the individual correction values being assigned to the co-ordinate values of the co-ordinate system.

8. A method according to claim 7, in which the correction values are scalar values representing the intensity or an amount of shift in radiation direction of the beam used for generating the structure.

9. A method according to claim 7, in which the correction values are vectors, representing an amount and a direction of a shift of the beam used for generating the structure.

10. A method according to claim 6 in which the correction matrix contains correction values, representing correction information for correcting pattern faults caused by various process influences.

11. A method according to claim 1 in which the intermediate values for points located between the coordinate values are determined by interpolation.

12. A method according to claim 6 in which the intermediate values for points located between the coordinate values are determined by interpolation.

* * * * *